United States Patent
Seddon et al.

(10) Patent No.: US 9,564,409 B2
(45) Date of Patent: Feb. 7, 2017

(54) METHODS OF FORMING SEMICONDUCTOR PACKAGES WITH AN INTERMETALLIC LAYER COMPRISING TIN AND AT LEAST ONE OF SILVER, COPPER OR NICKEL

(71) Applicant: Semiconductor Components Industries, LLC, Phoenix, AZ (US)

(72) Inventors: Michael J. Seddon, Gilbert, AZ (US); Francis J. Carney, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/606,667

(22) Filed: Jan. 27, 2015

(65) Prior Publication Data

US 2016/0218074 A1    Jul. 28, 2016

(51) Int. Cl.
*H01L 23/00* (2006.01)
*H01L 21/78* (2006.01)
(Continued)

(52) U.S. Cl.
CPC .......... *H01L 24/11* (2013.01); *H01L 21/6836* (2013.01); *H01L 21/78* (2013.01); *H01L 23/482* (2013.01);
(Continued)

(58) Field of Classification Search
CPC .......... H01L 24/03; H01L 24/05; H01L 24/13; H01L 24/11; H01L 2224/8481; H01L 2224/8581; H01L 2224/8681; H01L 21/4825
See application file for complete search history.

(56) References Cited

U.S. PATENT DOCUMENTS 8,610,270 B2 *  12/2013  Lai .......................... H01L 24/13
                                                            257/738
8,803,337 B1 *  8/2014   Lin .......................... H01L 24/11
                                                            257/780
(Continued)

FOREIGN PATENT DOCUMENTS

DE         19531158 A1      2/1997
JP        2009 290007 A    12/2009
(Continued)

OTHER PUBLICATIONS

Loomans, M. E. et al. in "Tin-Silver-Copper Eutectic Temperature and Composition," Metallurgical and Materials Transactions A, Apr. 2000, vol. 31, Issue 4, pp. 1155-1162.*

(Continued)

*Primary Examiner* — Michael Jung
(74) *Attorney, Agent, or Firm* — Adam R. Stephenson, Ltd.

(57) ABSTRACT

A method of forming a semiconductor package. Implementations include forming on a die backside an intermediate metal layer having multiple sublayers, each including a metal selected from the group consisting of titanium, nickel, copper, silver, and combinations thereof. A tin layer is deposited onto the intermediate metal layer and is then reflowed with a silver layer of a substrate to form an intermetallic layer having a melting temperature above 260 degrees Celsius and including an intermetallic consisting of silver and tin and/or an intermetallic consisting of copper and tin. Another method of forming a semiconductor package includes forming a bump on each of a plurality of exposed pads of a top side of a die, each exposed pad surrounded by a passivation layer, each bump including an intermediate metal layer as described above and a tin layer (Continued)

coupled to the intermediate metal layer is reflowed to form an intermetallic layer.

17 Claims, 6 Drawing Sheets

(51) Int. Cl.
    *H01L 23/482*     (2006.01)
    *H01L 21/683*     (2006.01)
    *H01L 21/48*     (2006.01)

(52) U.S. Cl.
    CPC .............. *H01L 24/05* (2013.01); *H01L 24/13* (2013.01); *H01L 24/16* (2013.01); *H01L 24/29* (2013.01); *H01L 24/32* (2013.01); *H01L 24/94* (2013.01); *H01L 21/4825* (2013.01); *H01L 24/03* (2013.01); *H01L 24/17* (2013.01); *H01L 24/27* (2013.01); *H01L 24/81* (2013.01); *H01L 24/83* (2013.01); *H01L 2221/68327* (2013.01); *H01L 2221/68381* (2013.01); *H01L 2224/0345* (2013.01); *H01L 2224/0347* (2013.01); *H01L 2224/0348* (2013.01); *H01L 2224/03416* (2013.01); *H01L 2224/03418* (2013.01); *H01L 2224/03444* (2013.01); *H01L 2224/03452* (2013.01); *H01L 2224/03462* (2013.01); *H01L 2224/03464* (2013.01); *H01L 2224/0401* (2013.01); *H01L 2224/04026* (2013.01); *H01L 2224/05075* (2013.01); *H01L 2224/05082* (2013.01); *H01L 2224/05083* (2013.01); *H01L 2224/05147* (2013.01); *H01L 2224/05155* (2013.01); *H01L 2224/05166* (2013.01); *H01L 2224/05171* (2013.01); *H01L 2224/05639* (2013.01); *H01L 2224/05647* (2013.01); *H01L 2224/11462* (2013.01); *H01L 2224/11464* (2013.01); *H01L 2224/11849* (2013.01); *H01L 2224/1308* (2013.01); *H01L 2224/13111* (2013.01); *H01L 2224/13139* (2013.01); *H01L 2224/13147* (2013.01); *H01L 2224/13155* (2013.01); *H01L 2224/13166* (2013.01); *H01L 2224/13171* (2013.01); *H01L 2224/16227* (2013.01); *H01L 2224/16503* (2013.01); *H01L 2224/16507* (2013.01); *H01L 2224/17106* (2013.01); *H01L 2224/2908* (2013.01); *H01L 2224/29111* (2013.01); *H01L 2224/29139* (2013.01); *H01L 2224/29147* (2013.01); *H01L 2224/29155* (2013.01); *H01L 2224/29166* (2013.01); *H01L 2224/29171* (2013.01); *H01L 2224/32225* (2013.01); *H01L 2224/32245* (2013.01); *H01L 2224/32503* (2013.01); *H01L 2224/8181* (2013.01); *H01L 2224/81439* (2013.01); *H01L 2224/81815* (2013.01); *H01L 2224/81825* (2013.01); *H01L 2224/8381* (2013.01); *H01L 2224/83439* (2013.01); *H01L 2224/83815* (2013.01); *H01L 2224/83825* (2013.01); *H01L 2224/8481* (2013.01); *H01L 2224/8581* (2013.01); *H01L 2224/8681* (2013.01); *H01L 2224/94* (2013.01); *H01L 2924/00015* (2013.01); *H01L 2924/01327* (2013.01); *H01L 2924/10162* (2013.01); *H01L 2924/12041* (2013.01)

(56) References Cited

U.S. PATENT DOCUMENTS

| | | | |
|---|---|---|---|
| 2012/0181676 A1 | 7/2012 | Tsui et al. | |
| 2012/0273935 A1 | 11/2012 | Martens et al. | |
| 2013/0221521 A1* | 8/2013 | Yang | B23K 1/0016 257/737 |
| 2013/0285248 A1 | 10/2013 | Yin et al. | |
| 2014/0077377 A1 | 3/2014 | Sasaki et al. | |
| 2014/0175495 A1 | 6/2014 | Chuang et al. | |
| 2015/0162292 A1* | 6/2015 | Machida | H01L 24/16 257/737 |
| 2015/0171039 A1* | 6/2015 | Cheng | H01L 21/76898 257/737 |
| 2015/0184446 A1* | 7/2015 | Veerasamy | E06B 3/6775 428/34 |
| 2015/0340328 A1* | 11/2015 | Gandhi | H01L 24/03 257/762 |

FOREIGN PATENT DOCUMENTS

| | | |
|---|---|---|
| JP | 2009290007 A | 12/2009 |
| JP | 2013157483 A | 8/2013 |
| WO | 2013140936 A1 | 9/2013 |

OTHER PUBLICATIONS

Li, D. et al. in "Characteristics of intermetallics and micromechanical properties during thermal ageing of Sn—Ag—Cu flip-chip solder interconnects," Materials Science and Engineering: A, vol. 391, Issues 1-2, 25 Jan. 2005, pp. 95-103.*

Etschmaier, H. et al. in "Reaction dynamics of diffusion soldering with the eutectic Au—Sn ally on copper and silver substrates," Intermetallics, vol. 20, Issue 1, Jan. 2012, pp. 87-92.*

"Formation and Growth of Intermetallics at the Interface Between Lead-free Solders and Copper Substrates," by T.A. Siewert, NIST, Boulder, Colorado and J.C. Madeni and S. Liu, Colorado School of Mines, Golden, Colorado, published as early as Nov. 4, 2014.

"Semiconductor Wafer Backside Metallization: Die Attach for High Thermal Demand Applications," Jonathan Harris, CMC Interconnect Technologies, published online at least as early as Nov. 13, 2014, available online at http://www.cmclaboratories.com/documents/backside_metallization_of_sc_wafers_IEEE_tutorial_20070417.pdf.

"Vincotech's modules with pre-applied phase-change material" (website article), Patrick Baginski, published online at least as early as Dec. 5, 2014 by Vincotech GmbH, available online at http://www.vincotech.com/en/support/technical-papers/module-mechanics-and-packaging/modules-with-pre-applied-phase-change-material.html, discussing Vincotech's use of Loctite PSX-pm as a phase-change material, last visited Dec. 5, 2014.

"Vincotech's modules with pre-applied phase change material" (PDF article), Patrick Baginski, published online at least as early as Dec. 5, 2014, available online at http://www.vincotech.com/fileadmin/user_upload/articles/Modules-with-Phase-Change-Material/Module%20with%20Phase-Change%20Material.pdf, discussing Vincotech's use of Loctite PSX-pm as a phase change material, last visited Dec. 5, 2014.

"Loctite PSX-pm Technical Data Sheet," published online at least as early as Dec. 5, 2014 by Henkel AG & Company, KGaA, available online at https://tds.us.henkel.com/NA/UT/HNAUTTDS.nsf/web/A8D410E33CBA99C385257674006AF709/$File/PSX-PM-EN.pdf, last visited Dec. 5, 2014.

"Material Safety Data Sheet for Loctite TCP 4000 PM known as 0.5KG PSX-PM(Med Dry) EN/CH," published online at least as early as Dec. 5, 2014 by Henkel AG & Company, KGaA, available online at http://hybris.cms.henkel.com/henkel/msdspdf?country=US&language=EN&matnr=1247854, last visited Dec. 5, 2014.

Takahashi et al., "Development of Ag3Sn Intermetallic Compound Joint for Power Semiconductor Devices," Electrochemcial and Solid-State Letters, V. 12, No. 7, p. H263-H265 (2009).

C. Schmetterer, H. Flandorfer, CH. Luef, A. Kodentsov, and H. Ipser, "Cu—Ni—Sn: A Key System for Lead-Free Soldering," Journal of Electronic Materials, vol. 38, No. 1, pp. 10-24, published online Aug. 8, 2008, Warrendale, PA, US.

* cited by examiner

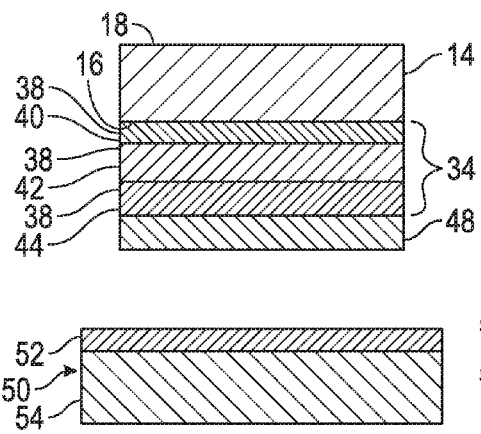
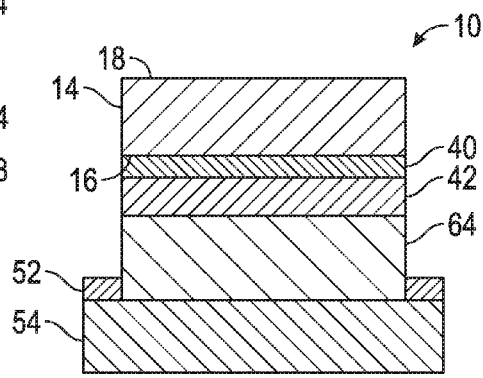
FIG. 9  FIG. 10
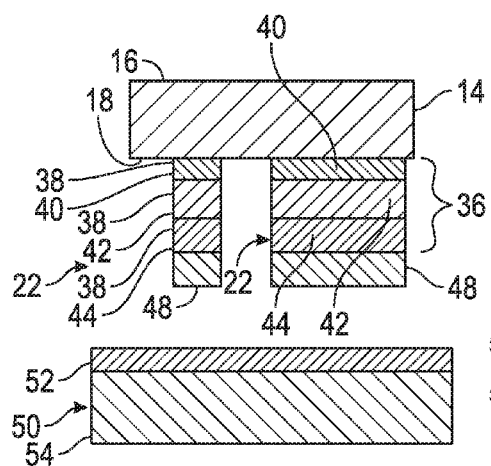
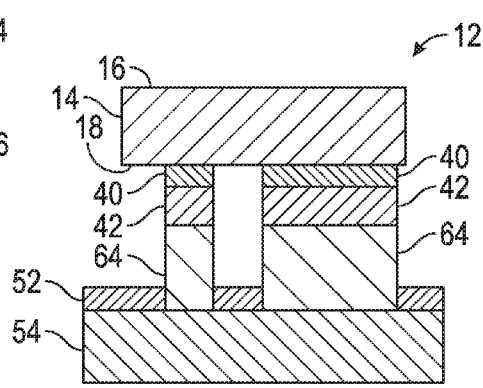
FIG. 11  FIG. 12

METHODS OF FORMING SEMICONDUCTOR PACKAGES WITH AN INTERMETALLIC LAYER COMPRISING TIN AND AT LEAST ONE OF SILVER, COPPER OR NICKEL

BACKGROUND

1. Technical Field

Aspects of this document relate generally to semiconductor device mounting. More specific implementations relate to mounting semiconductor devices by reflowing metals or metal solders.

2. Background Art

The fabrication of semiconductor devices often includes the mounting of one or more die and/or other items onto a printed circuit board (PCB) (motherboard) (board) or other substrate. This coupling may be accomplished through the reflow of a metal or metal solder which, when solidified, forms a bond between the die (or other elements) and the board or substrate. Die and other elements also may be coupled to heat sinks through the reflow of metal or metal solder.

SUMMARY

Implementations of methods of forming a semiconductor package may include: forming an intermediate metal layer onto a die backside, the intermediate metal layer having a plurality of sublayers, each sublayer including a metal selected from the group consisting of titanium, nickel, copper, silver, and any combination thereof; depositing a tin layer onto the intermediate metal layer; and reflowing the tin layer with a silver layer of a substrate to form an intermetallic layer having a melting temperature greater than 260 degrees Celsius.

Implementations of a method of forming a semiconductor package may include one, all, or any of the following:

The substrate may include a copper layer coupled to the silver layer of the substrate prior to reflowing the tin layer with the silver layer of the substrate.

The plurality of sublayers of the intermediate metal layer may include a sublayer including titanium and a sublayer including nickel.

The plurality of sublayers of the intermediate metal layer may include a sublayer including silver.

The plurality of sublayers may include the following arrangement of the plurality of sublayers: a sublayer including titanium formed directly onto the die backside, a sublayer including nickel deposited directly onto the sublayer including titanium, and a sublayer including silver deposited directly onto the sublayer including nickel.

The plurality of sublayers of the intermediate metal layer may include a sublayer including copper.

The plurality of sublayers may include the following arrangement of the plurality of sublayers: a sublayer including titanium formed directly onto the die backside, a sublayer including nickel deposited directly onto the sublayer including titanium, and a sublayer including copper deposited directly onto the sublayer including nickel.

The plurality of sublayers of the intermediate metal layer may include a sublayer including silver.

The plurality of sublayers may include the following arrangement of the plurality of sublayers: a sublayer including titanium formed directly onto the die backside, a sublayer including nickel deposited directly onto the sublayer including titanium, a sublayer including copper deposited directly onto the sublayer including nickel, and a sublayer including silver deposited directly onto the sublayer including copper.

The plurality of sublayers of the intermediate metal layer may include a sublayer including titanium and a sublayer including copper.

The plurality of sublayers may include the following arrangement of the plurality of sublayers: a sublayer including titanium formed directly onto the die backside, and a sublayer including copper deposited directly onto the sublayer including titanium.

The plurality of sublayers of the intermediate metal layer may include a sublayer including silver.

The plurality of sublayers may include the following arrangement of the plurality of sublayers: a sublayer including titanium formed directly onto the die backside, a sublayer including copper deposited directly onto the sublayer including titanium, and a sublayer including silver deposited directly onto the sublayer including copper.

The intermetallic layer may include one of: an intermetallic consisting of silver and tin, and; an intermetallic consisting of copper and tin.

In implementations no solder paste and no solder preform is used during the method of forming the semiconductor package.

Implementations of methods of forming a semiconductor package may include: forming a bump on each of a plurality of exposed pads of a top side of a die, each exposed pad surrounded by a passivation layer on the top side of the die, each bump including an intermediate metal layer and a tin layer deposited directly onto the intermediate metal layer, each intermediate metal layer including a plurality of sublayers, each sublayer including a metal selected from the group consisting of titanium, nickel, copper, silver, and any combination thereof; and reflowing each tin layer with a silver layer of a substrate to form a plurality of intermetallic layers, each intermetallic layer having a melting temperature greater than 260 degrees Celsius and including one of: an intermetallic consisting of silver and tin, and; an intermetallic consisting of copper and tin.

Implementations of semiconductor packages may include: a plurality of layers arranged in the following order: a die; a layer including titanium coupled to the die; an intermetallic layer including one of an intermetallic consisting of silver and tin and an intermetallic consisting of copper and tin; and a substrate including a copper layer; wherein the intermetallic layer has a melting temperature greater than 260 degrees Celsius.

Implementations of semiconductor packages may include one, all, or any of the following:

A layer including nickel formed between the layer including titanium and the intermetallic layer.

A layer including copper formed between the layer including titanium and the intermetallic layer.

The layer including titanium may be formed onto a backside of the die.

The layer including titanium may be formed onto an exposed pad of the die.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 9 is a cross section view of a die, multiple metallic layers, and a substrate used in the formation of an implementation of a semiconductor device package;

FIG. 10 is a cross section view of an implementation of a semiconductor device package formed from the elements of FIG. 9;

FIG. 11 is a cross section view of a die, multiple metallic layers, and a substrate used in the formation of an implementation of a semiconductor device package;

FIG. 12 is a cross section view of an implementation of a semiconductor device package formed from the elements of FIG. 11;

DESCRIPTION

This disclosure, its aspects and implementations, are not limited to the specific components, assembly procedures or method elements disclosed herein. Many additional components, assembly procedures and/or method elements known in the art consistent with the intended semiconductor packages with a single reflow intermetallic layer and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages with a single reflow intermetallic layer and related methods, and implementing components and methods, consistent with the intended operation and methods.

As used herein, a die "backside" is defined as a side of the die that either does not have electrical connectors thereon or only has electrical connectors, such as pads or other elements, which are intended to act as an electrical ground or electrical routing to the die. As used herein, a die "top side" is defined as a side of the die that has at least one electrical connector thereon, such as a pad or other element which is not intended solely to act as an electrical ground to the die. As used herein "intermetallic(s)" refers to a solid-state compound having a fixed stoichiometry of two or more elemental metals, the atoms of each elemental metal having fixed rather than random positions within a lattice structure. "Intermetallic layer(s)" as used herein refers more generically to a layer which includes one or more intermetallics but which in some cases may not be entirely formed of intermetallics as defined above.

Referring to FIGS. 1-10, various implementations of methods of forming a semiconductor device package (package) involve utilizing wafer backside metallization which is later sawn through or otherwise segmented after the die have been singulated. In FIGS. 1-10 the die have already been singulated and the backside metallization has already been sawn through or otherwise segmented. In implementations the backside metallization, including an intermediate metal layer (including all sublayers), and a tin layer, are all applied using wafer backside metallization techniques prior to the wafer being singulated.

Figure 1:
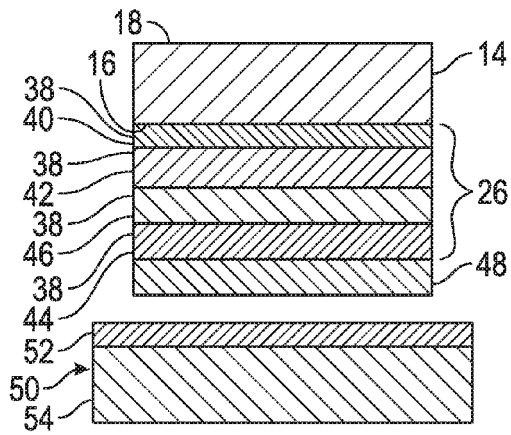
FIG. 1 is a cross section view of a die, multiple metallic layers, and a substrate used in the formation of an implementation of a semiconductor device package.
Figure 2:
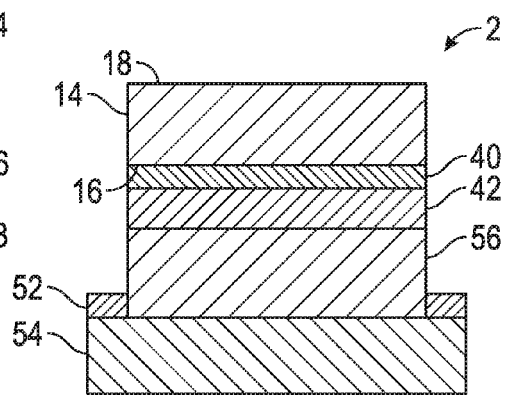
FIG. 2 is a cross section view of an implementation of a semiconductor device package formed from the elements of FIG. 1.

Referring now to FIGS. 1-2, in various implementations of a method of forming a semiconductor device package (package) 2 the method includes forming an intermediate metal layer 26 onto a backside 16 of a die 14. The intermediate metal layer 26 includes a plurality of sublayers 38. A first sublayer 38 including titanium (titanium sublayer) 40 is deposited directly onto the backside 16 of die 14. A sublayer 38 including nickel (nickel sublayer) 42 is deposited directly onto the titanium sublayer 40. As used herein, "deposition directly onto" the titanium sublayer is meant to include any deposition onto an unoxidized/unreduced titanium sublayer as well as deposition onto an oxidized or otherwise reduced film of the titanium sublayer 40 formed prior to the deposition of the nickel sublayer 42 thereon (this same meaning is intended throughout this document whenever one layer is deposited "directly" onto another). A sublayer 38 including copper (copper sublayer) 46 is deposited directly onto the nickel sublayer 42. A sublayer 38 including silver (silver sublayer) 44 is deposited directly onto the copper sublayer 46. In various implementations each sublayer disclosed herein is formed of at least 50 wt. %, at least 80 wt. %, at least 85 wt. %, at least 90 wt. %, at least 95 wt. %, at least 96 wt. %, at least 97 wt. %, at least 98 wt. %, and/or at least 99 wt. % of the metal after which it is named.

The deposition of each sublayer 38, and of all other metal layers described herein, may be done using any thin film chemical and/or physical deposition technique such as, by non-limiting example, plating, electroplating, electroless plating, chemical solution deposition (CSD), chemical bath deposition (CBD), spin coating, chemical vapor deposition (CVD), metalorganic chemical vapor deposition (MOCVD), plasma enhanced CVD (PECVD), atomic layer deposition (ALD), physical vapor deposition (PVD), thermal evaporation, electron beam evaporation, molecular beam epitaxy (MBE), sputtering, pulsed laser deposition, ion beam deposition, cathodic arc deposition (arc-PVD), electrohydrodynamic deposition (electrospray deposition), and any other method of metal layer deposition.

After the aforementioned layers have been deposited using any of the wafer backside metallization techniques as described above, the wafer may be singulated to produce single units as shown in FIG. 1 which may then be attached to a substrate 50. In some implementations, the layers may be deposited after singulation into single units, however. In implementations the substrate 50 is a portion of a ceramic board. Some representative examples of singulation processes will be described hereafter. The substrate 50 includes a silver layer 52 atop a copper layer 54 and the bottom tin layer 48 is reflowed with the silver layer 52 using a conventional 260 degrees Celsius reflow profile, such that the silver sublayer 44 and copper sublayer 46 also melt or at least become softened or diffuse/intermix sufficiently for the silver of the silver sublayer 44 and copper of the copper sublayer 46 to mix with the tin of the tin layer 48 to form intermetallics of tin, silver and/or copper. The tin layer 48 is pure tin or substantially pure tin and melts at 231 degrees Celsius and wets well to the substrate 50 with minimum voiding. The presence of silver and copper, even in small amounts, with the molten tin, results in the formation of intermetallics of one or more of silver, tin and/or copper fairly quickly, the intermetallics having melting temperatures (i.e., liquidus temperatures) greater than that of tin, which prevents or helps to prevent the flow of tin across the substrate 50 laterally.

Figure 13:
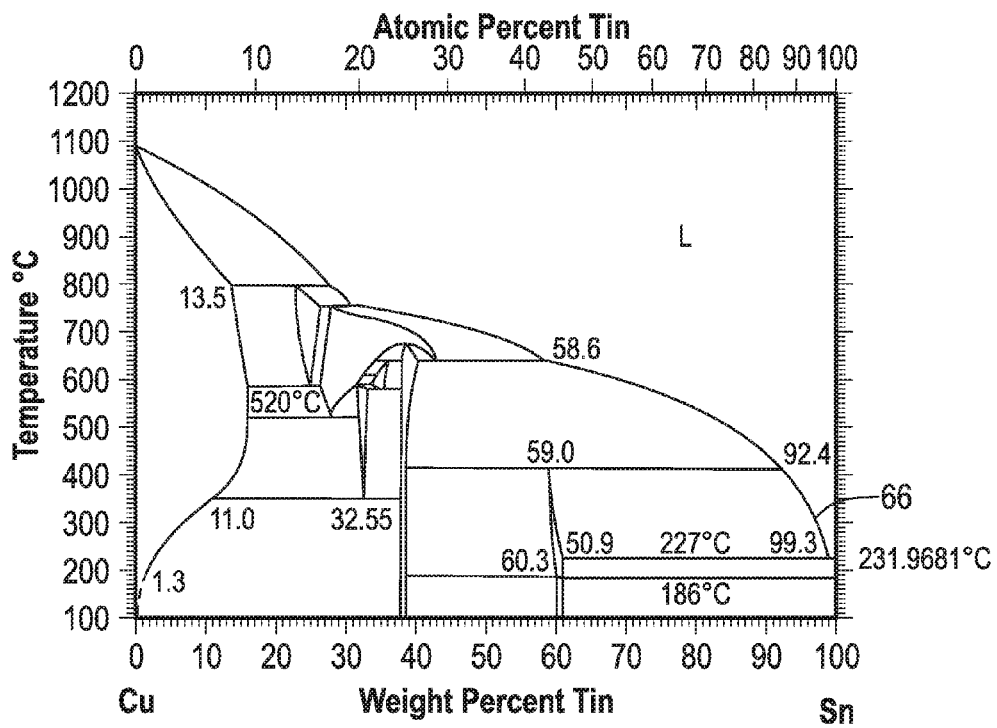
FIG. 13 is a copper-tin binary phase diagram.
Figure 14:
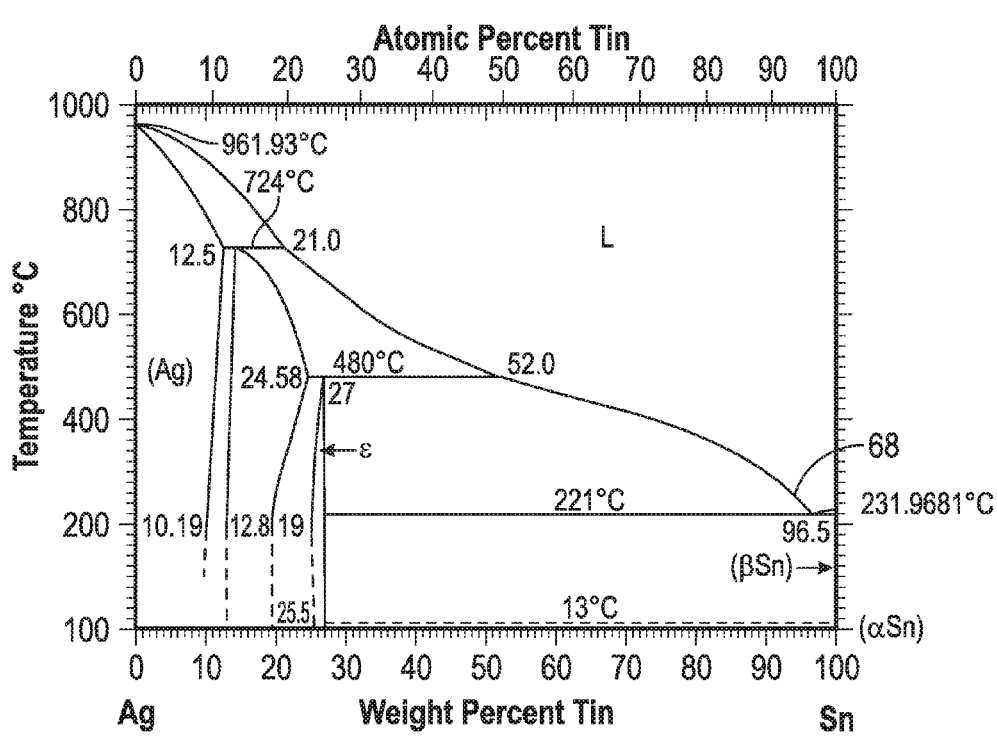
FIG. 14 is a silver-tin binary phase diagram.

Referring to the binary phase diagram of the copper/tin system of FIG. 13, even a small weight percent of about 2-3% copper in tin, at point 66 on the phase diagram, will raise the liquidus temperature from about 232 degrees Celsius to about 260 degrees Celsius. The liquidus temperature is the line above which only liquid phase(s) exist—the solidus temperature is the line below which only solid phase(s) exist. Between the liquidus and solidus temperatures some solid and some liquid phases may exist. For purposes of this disclosure, the liquidus temperature corresponds with the melting point, or melting temperature of a material. Referring to the binary phase diagram of the silver/tin system of FIG. 14, even a small weight percent of about 6% silver in tin, at point 68 on the phase diagram, will raise the liquidus temperature from about 232 degrees Celsius to about 260 degrees Celsius—while the solidus temperature remains at 221 degrees Celsius. At 10 wt. % of silver and 90 wt. % tin the liquidus temperature is 295 degrees Celsius while the solidus temperature remains at 221 degrees Celsius. At 5 wt. % silver and 95 wt. % tin the liquidus temperature is 240 degrees Celsius and the solidus temperature is 221 degrees Celsius. At about 27 wt. % silver and about 73 wt. % tin the liquidus temperature is 400 degrees Celsius and the solidus temperature remains 221 degrees Celsius. In various implementations, a 3 micron solder joint could be formed during reflow to form a 73 wt. % tin 27 wt. % silver structure by beginning with a 1.793 micron layer of tin and a 1.207 micron layer of silver prior to reflow.

The raising of the melting temperature of the intermetallic layer 56 of the semiconductor package 2 thus results in a structure which will not reflow and/or re-melt during subsequent temperature increases when other devices are being reflowed or otherwise attached to the substrate 50 using a standard 260 degrees Celsius reflow profile. The properties of the intermetallic layer 56 thus produce a "single reflow" package or, in other words, the intermetallic layer 56 is a "single reflow" layer that will only reflow once under a standard 260 degrees Celsius reflow profile. This allows the die 14 to stay in place during subsequent reflows when other devices are mounted to the board of which the substrate 50 is a part. Conventional backmetal layers of titanium/nickel/gold-tin described more below, and other conventional backmetal materials, do not have an increased melting temperature after the first reflow, but are susceptible to reflowing again when experiencing the same reflow profile temperature.

In terms of actual localized composition, there may be many different intermetallics or intermetallic compounds within the intermetallic layer 56 which may include any intermetallics comprising two or more of silver, tin and/or copper, though the intermetallic layer 56 may also be partially in the form of a solution. In other words, there may be some pure tin, some pure copper, some pure silver, some pure nickel, and so forth, in solution, with some intermetallics interspersed throughout, such as precipitated intermetallic crystals in solid solution, and/or there may be planar intermetallic layers particularly at boundary points (such as the boundary of the intermetallic layer 56 with the copper layer 54 and with the copper sublayer 46 (or the bottommost sublayer 38 after reflow in the other examples described herein), without the entire intermetallic layer 56 being comprised of intermetallics of two or more of silver, tin and/or copper. Nevertheless the intermetallic layer 56 due to the presence of the intermetallics in the layer 56 ultimately has a melting temperature greater than 260 degrees Celsius so that it does not reflow during subsequent high temperature processes that will include raising the temperature of the substrate 50 and/or the semiconductor package 2 to, or to about, 260 degrees Celsius.

The final composition of intermetallics in the intermetallic layer 56 may vary between a wide range since, as shown with the phase diagrams, only just above 2 weight percent copper or 4 weight percent silver needs to be mixed in with the tin to raise the melting temperature of the overall mixture above 260 degrees Celsius and, when more silver or copper are added, the melting temperature continues to increase. With conventional titanium/nickel/gold-tin back metallization described further below there is a fairly limited window of thermal operation as the gold-tin layer (which in some conventional implementations is 3 microns thick) requires a composition that is 80+/−0.8 wt. % gold.

The layers of the structure of FIG. 1 may have the following thicknesses. The titanium sublayer 40 may be, or may be about, 1.15 kiloAngstroms (kÅ) thick, though a wide range of thicknesses could be used. This sublayer is used for adhesion to the silicon of the die 14 and can be replaced with other conventional materials such as titanium-tungsten (TiW), chromium (Cr), nickel-chromium (NiCr), and the like. The nickel sublayer 42 may be, or may be about, 1 kÅ to about 6 kÅ. In particular implementations it may be 5 kÅ. This layer may be thicker for higher temperature applications (such as for high temperature storage requirements for hotter light emitting diodes (LEDs)), or when the tin layer 48 is thicker so that there is less of a risk of much or most (or all) of the nickel being consumed into nickel-tin intermetallics which is generally undesirable, and/or when the substrate 50 does not include a silver layer 52 to consume some of the tin into silver-tin intermetallics thereby reducing the formation of nickel-tin intermetallics. Too thick of a nickel sublayer 42 may result in excessive stresses. The copper sublayer 46 may be, or may be about, 4 kÅ thick, and in implementations may range from 0.1 kÅ to 12 kÅ. The silver sublayer 44 may be, or may be about, 2 kÅ thick, and in implementations may range between 0.5 kÅ and 12 kÅ or between 0 kÅ and 12 kÅ (in some implementations, as described herein, there is no silver sublayer 44 at all). In implementations the tin layer 48 may be, or may be about, 16 kÅ thick, and in implementations may range from 10 kÅ to 30 kÅ.

The ratio of silver to tin can be adjusted based on the application. Increasing the thickness of the tin layer 48 allows for additional or enhanced wetting to substrate 50 and reduction of voids if the surface of the substrate 50 is rough. Increasing the thickness of the silver sublayer 44 increases protection of the nickel (i.e., preventing the nickel from being consumed into nickel-tin intermetallics). It can, however, be desirable that some of the nickel, but not all of the nickel, be consumed in nickel-tin intermetallics. Accordingly, if the silver sublayer 44 is too thick this can restrict the amount of nickel-tin intermetallics too much and can actually reduce the shear strength and consistency of the semiconductor package 2. The ratio of silver to tin may thus be adjusted so that the desired silver-tin intermetallics in the desired amount are formed during reflow. The ratio of copper to tin can also be adjusted based on the particular application. Increasing the thickness of the copper sublayer 46 allows for a thicker tin layer 48 because a thicker copper sublayer 46 better slows down or impedes the formation of nickel-tin intermetallics.

As can be seen from comparing FIG. 2 to FIG. 1, the tin layer 48, silver layer 52 of the substrate 50, silver sublayer 44, and copper sublayer 46 may be consumed in the intermetallic layer 56. The use of the sublayers 38 and tin layer 48 may also allow for adhesion of the die 14 to the substrate 50 without the use of solder paste or preforms. The copper layer 54 and the portion of the copper sublayer 46 that remains may provide solderable surfaces for the tin and intermetallics and other elements of the intermetallic layer 56. In implementations the copper of the copper layer 54 of the substrate 50 may also form intermetallics with the tin of the tin layer 48, further providing a strong die attach and reducing the amount of nickel-tin intermetallics by consuming some of the tin into tin-copper intermetallics.

Figure 3:
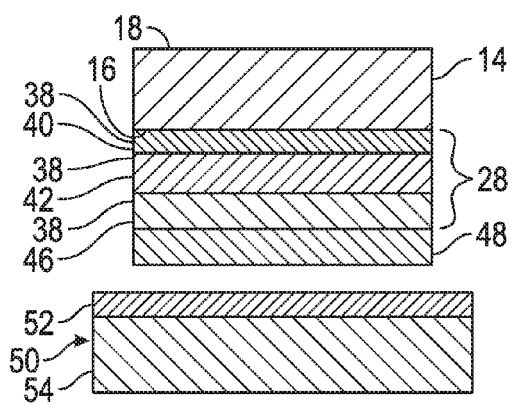
FIG. 3 is a cross section view of a die, multiple metallic layers, and a substrate used in the formation of an implementation of a semiconductor device package.
Figure 4:
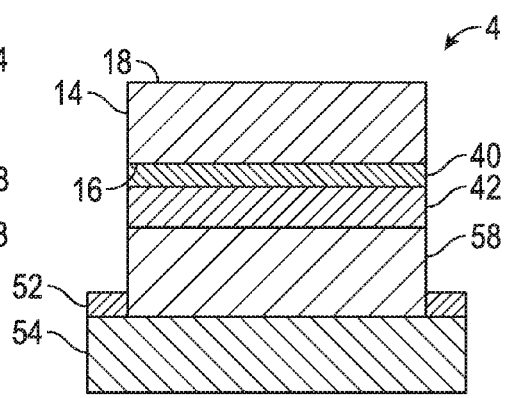
FIG. 4 is a cross section view of an implementation of a semiconductor device package formed from the elements of FIG. 3

FIGS. 3-4 show a similar materials system to that shown in FIGS. 1-2 but with an intermediate metal layer 28 that does not include a silver sublayer 44. The remaining layers may have the same thicknesses described above. The processes and results are similar to above, except that the intermetallic layer 58 may include somewhat different overall percentages of silver, copper and tin and therefore may have different intermetallics and/or different amounts of different intermetallics, different amounts of metals or compounds precipitated or in solution, etc. Nevertheless intermetallic layer 58 has a melting temperature greater than 260 degrees Celsius and semiconductor package 4 otherwise generally has similar single-reflow properties as those described above with respect to semiconductor package 2. As can be seen by comparing FIG. 3 to FIG. 4 the copper sublayer 46, tin layer 48 and silver layer 52 of the substrate 50 may be fully or partially consumed in the intermetallic layer 58.

Figure 5:
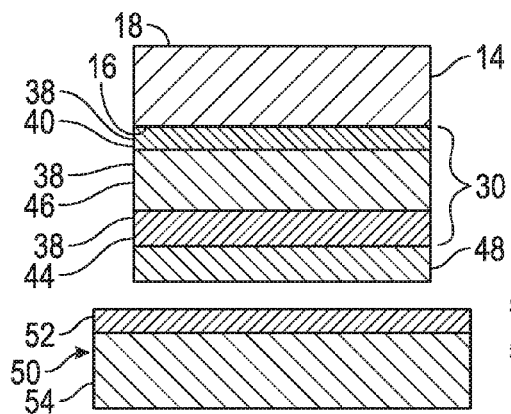
FIG. 5 is a cross section view of a die, multiple metallic layers, and a substrate used in the formation of an implementation of a semiconductor device package.
Figure 6:
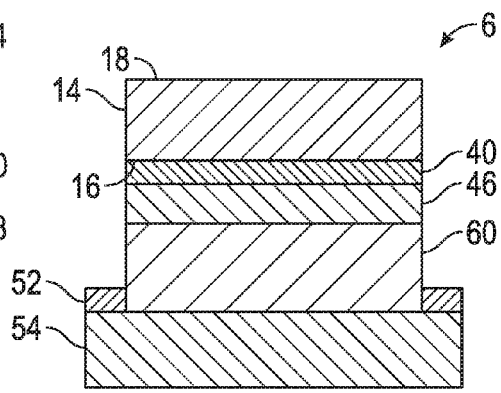
FIG. 6 is a cross section view of an implementation of a semiconductor device package formed from the elements of FIG. 5.

FIGS. 5-6 show a similar materials system to that shown in FIGS. 1-2 but with an intermediate metal layer 30 that does not include a nickel sublayer 42. The remaining layers may have the thicknesses described above, though in implementations the thickness of the copper sublayer 46 may range between 1 kÅ and 40 kÅ. The processes and results are similar to above, however, except that the intermetallic layer 60 may have somewhat different overall percentages of silver, copper and tin and therefore may have different intermetallics and/or different amounts of different intermetallics, different amounts of metals or compounds precipitated or in solution, etc. Nevertheless intermetallic layer 60 has a melting temperature greater than 260 degrees Celsius and semiconductor package 6 otherwise generally has similar single-reflow properties as those described above with respect to semiconductor package 2. As can be seen by comparing FIG. 5 to FIG. 6 the tin layer 48, silver sublayer 44, a portion of the copper sublayer 46, and the silver layer 52 of the substrate 50 may be consumed in the intermetallic layer 60.

Figure 7:
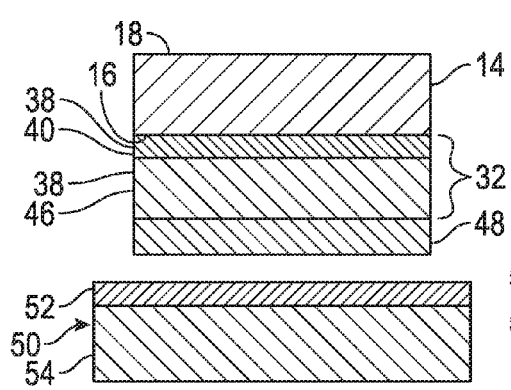
FIG. 7 is a cross section view of a die, multiple metallic layers, and a substrate used in the formation of an implementation of a semiconductor device package.
Figure 8:
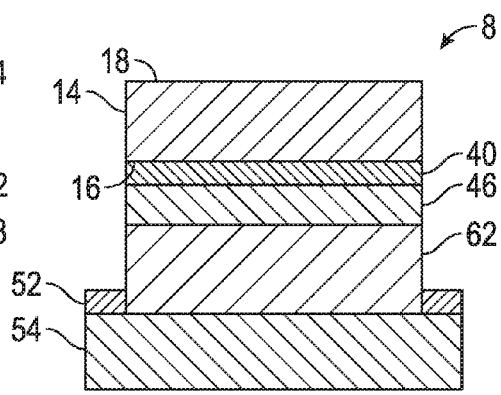
FIG. 8 is a cross section view of an implementation of a semiconductor device package formed from the elements of FIG. 7.

FIGS. 7-8 show a similar materials system to that shown in FIGS. 1-2 but with an intermediate metal layer 32 that does not include a nickel sublayer 42 or a silver sublayer 44. The remaining layers may have the thicknesses described above. The processes and results are similar to above, however, except that the intermetallic layer 62 may include somewhat different overall percentages of silver, copper and tin and therefore may have different intermetallics and/or different amounts of different intermetallics, different amounts of metals or compounds precipitated or in solution, etc. Nevertheless intermetallic layer 62 has a melting temperature greater than 260 degrees Celsius and semiconductor package 8 otherwise generally has similar single-reflow properties as those described above with respect to semiconductor package 2. As can be seen by comparing FIG. 7 to FIG. 8 the tin layer 48, a portion of the copper sublayer 46, and the silver layer 52 of the substrate 50 are fully or partially consumed in the intermetallic layer 62.

FIGS. 9-10 show a similar materials system to that shown in FIGS. 1-2 but with an intermediate metal layer 34 that does not include a copper sublayer 46. The remaining layers may have the thicknesses described above, though in implementations the silver sublayer 44 may have a thickness of 4 kÅ and may range between 1 kÅ and 12 kÅ. The processes and results are similar to above, however, except that the intermetallic layer 64 may have somewhat different overall percentages of silver, copper and tin and therefore may have different intermetallics and/or different amounts of different intermetallics, different amounts of metals or compounds precipitated or in solution, etc. In particular, since there is no copper sublayer 46, and although there may be some copper in the intermetallic layer 64 from the copper layer 54 of the substrate 50, the intermetallics of the intermetallic layer 64 may predominantly comprise intermetallics of silver and tin. Intermetallics of copper and tin may form at the interfaces of the intermetallic layer 64 and the copper layer 54 of the substrate 50, though. Intermetallic layer 64 also has a melting temperature greater than 260 degrees Celsius and semiconductor package 10 otherwise generally has similar single-reflow properties as those described above with respect to semiconductor package 2. As can be seen by comparing FIG. 9 to FIG. 10 the tin layer 48, silver sublayer 44, and the silver layer 52 of the substrate 50 may be consumed in the intermetallic layer 64 during reflow. The silver sublayer 44 between the nickel sublayer 42 and the tin layer 48 impedes the diffusion of the tin with the nickel and limits the formation of nickel-tin intermetallics, which may allow for a stronger die bond or solder joint.

The materials systems of FIGS. 9 and 11 could in some implementations experience problems with all or substantially all of the nickel being consumed into nickel-tin intermetallics if too thick a tin layer 48 is included. By non-limiting example, in implementations a thicker tin layer 48 may be required for reflowing onto rougher substrates 50 (such as rougher ceramic substrates), when the substrate 50 is not a part of a ceramic substrate, when less voiding is required, or when a taller solder joint is needed for increased reliability. In such instances the ratio of tin to silver is increased, and in such instances the implementations of FIG. 1, 3, 5 or 7 may be used instead which either do not include a nickel sublayer 42 or include a copper sublayer 46 between the tin layer 48 and the nickel sublayer 42 in order to prevent or hinder the formation of nickel-tin intermetallics (by consuming some of the tin into tin-copper intermetallics). The reduction of nickel-tin intermetallics may result in a stronger die bond/solder joint. Some nickel-tin intermetallics can be desirable and show good wetting and adhesion during reflow but when all of the nickel is consumed by the tin into nickel-tin intermetallics so that there is no longer any pure nickel remaining then the adhesion is generally decreased and the shear strength of the semiconductor package reduced.

Furthermore, the nickel sublayer 42 is a high stress metallization which can be more difficult to separate during singulation than other backmetals. For example, depending on the die size, the nickel sublayer 42 could be difficult to separate using a jet ablation process if the nickel sublayer 42 is thicker than 1 micron. In particular implementations, it may also be desirable to form a semiconductor package without nickel for different die shapes or for extremely small die 14, such as less than 180 microns on a side, or very thin die 14, such as less than 100 microns thick. Such die can have inherently high stresses which means that nickel is not a viable (or not as viable an) option. In addition, because the jet ablation force required to break a thick nickel layer may place force on the die greater than the attractive force between the die and the tape, attempting to jet ablate thick nickel may result in washing the die off the tape. In such implementations, the nickel sublayer 42 may be replaced with a copper sublayer 46. Such a replacement may also improve performance during the jet ablation process.

Figure 19:
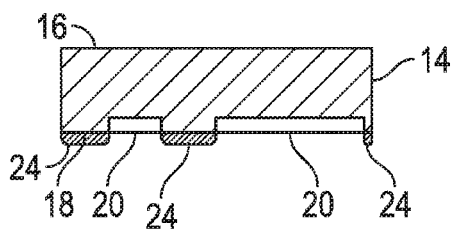
FIG. 19 is a cross section view of a die with die pads on a top side of the die exposed through a passivation layer.

FIGS. 11-12 show a semiconductor package 12 formed using a different method implementation wherein an intermediate metal layer 36 is applied to the top side 18 of die 14, instead of the backside 16, in order to form bumps 22, for flip chip packaging. The layers in such method implementations may still have any of the thicknesses described above. Similar to what was described above with respect to the backmetal method implementations, the flip chip process may also be done to an entire wafer prior to singulation and reference is now made to FIGS. 19-23 and to FIGS. 11-12 to describe this process. The top side 18 of each die 14 prior to singulation includes a plurality of pads 20 (which are electrical contacts not intended to be used primarily as a ground) where each pad 20 is surrounded by a passivation layer 24, as shown in FIG. 19. The passivation layer may be, by non-limiting example, an oxide, nitride, a polyimide, or other material capable of passivating a silicon surface, and may be formed using any of a wide variety of passivating process methods for depositing/forming such materials.

Figure 20:
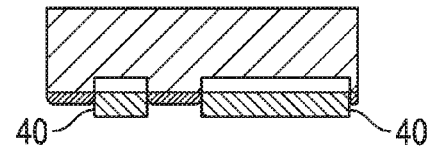
FIG. 20 illustrates an example of a processing step that can be performed in the formation of the semiconductor device package of FIG. 12.
Figure 21:
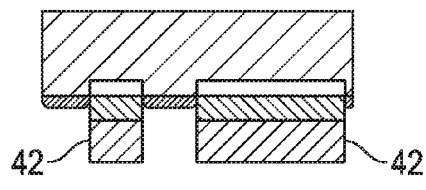
FIG. 21 illustrates an example of another processing step that can be performed in the formation of the semiconductor device package of FIG. 12.
Figure 22:
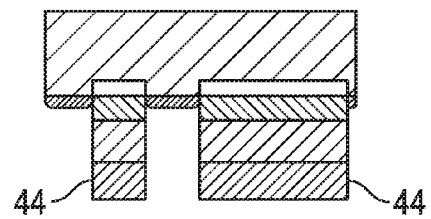
FIG. 22 illustrates an example of another processing step that can be performed in the formation of the semiconductor device package of FIG. 12.
Figure 23:
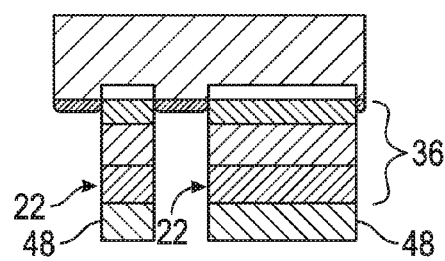
FIG. 23 illustrates an example of another processing step that can be performed in the formation of the semiconductor device package of FIG. 12.

Each sublayer 40 of the intermediate metal layer 36 is deposited in turn, beginning with the sublayer 40 deposited directly onto the pads 20 as shown in FIG. 20. The passivation layer 24 (or a masking material over the passivation layer 24 that is later removed) prevents electrical connection from forming during deposition (via electroplating, sputtering, evaporating, etc.) of sublayers 40 onto the spaces between the pads 20. Thus, as the sublayers 40 are deposited and as the tin layer 48 is deposited, the bumps 22 are formed. FIGS. 20-22 show, as a representative example, a titanium sublayer 40 deposited directly onto each pad 20 (FIG. 20), a nickel sublayer 42 deposited directly onto each titanium sublayer 40 (FIG. 21), and a silver sublayer 44 deposited directly onto each nickel sublayer 42 (FIG. 22). A tin layer 48 is deposited directly onto each silver sublayer 44 (FIG. 23). The tin layers 48 are then reflowed with the silver layer 52 of the substrate 50 which also causes the silver sublayers 44 to melt or at least soften and become diffuse, thus forming intermetallic layers 64, each of which may consume a silver sublayer 44, a tin layer 48 and the silver layer 52 of the substrate 50 directly below the bump 22. The selective deposition of each metallic layer only onto the portions without passivation may be done, by non-limiting example, using electroplating, electroless plating and other methods of metal layer deposition.

Although the intermediate metal layer 36 illustrated in the figures is similar to intermediate metal layer 34 of FIG. 9, this is only given as a representative example and the flip-chip procedure of FIGS. 11-12 could instead have the intermediate metal layers 32 as arranged in FIG. 7, or the intermediate metal layers 30 as arranged in FIG. 5, the intermediate metal layers 28 as arranged in FIG. 3, or the intermediate metal layers 26 as arranged in FIG. 1. In any case, the processes and results are similar to above as described with respect to the backmetal structures shown in FIGS. 1-10, with the resulting intermetallic layer having different overall percentages of silver, copper and tin and therefore having different intermetallics and/or different amounts of different intermetallics, different amounts of metals or compounds precipitated or in solution, etc. according to the particular sublayers 38 used. Whatever sublayers 38 are used, the intermetallic layer 64 of semiconductor package 12 has a melting temperature greater than 260 degrees Celsius and thus the semiconductor package 12 has similar single-reflow properties as those described above with respect to semiconductor package 2.

Figure 15:
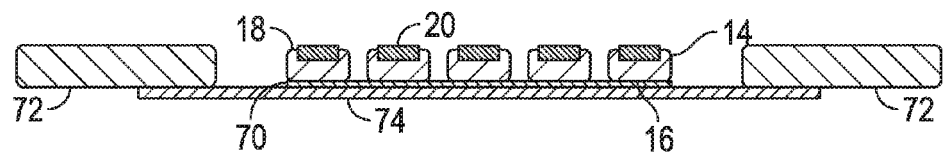
FIG. 15 illustrates an example of a processing step that can be performed in the formation of the semiconductor device package of any of FIGS. 2, 4, 6, 8 and 10.

Referring to FIGS. 15-18, and reverting back to the backmetal examples of FIGS. 1-10, in various implementations a backmetal 70 deposited on a backside 16 of a wafer may include one of the intermediate metal layers 26, 28, 30, 32, 34, 36 described herein as well as the tin layer 48. As shown in FIG. 15 the wafer may be etched from the top side 18 (which in the implementation shown is a side including pads 20 which are not intended to be only used as grounds) using, by non-limiting example, $SF_6$ plasma-based dry etching using the Bosch process or Time Division Multiplex (TDM) etching after selected portions of a passivation layer are removed. The passivation layer in implementations may be any disclosed in this document. The plasma etching may result in narrow scribe grids as low as 15 microns in thickness and may also allow no mechanical damage to die edges (such as chips or cracks), increased die per wafer, shaped die, keyed die, rounded corners, and increased die singulation throughput.

Figure 16:
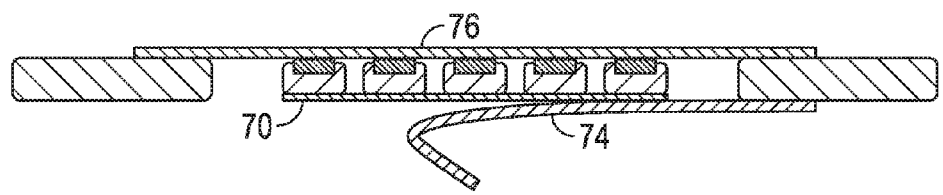
FIG. 16 illustrates an example of another processing step that can be performed in the formation of the semiconductor device package of any of FIGS. 2, 4, 6, 8 and 10.
Figure 17:
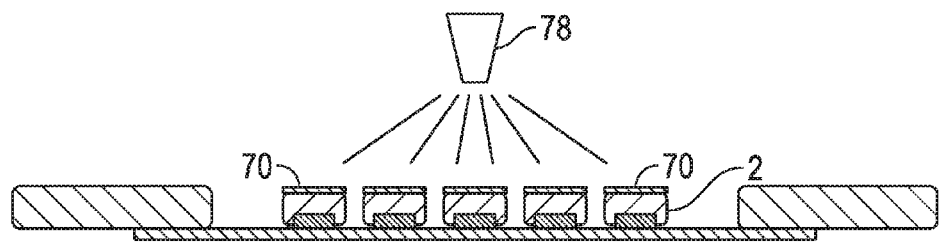
FIG. 17 illustrates an example of another processing step that can be performed in the formation of the semiconductor device package of any of FIGS. 2, 4, 6, 8 and 10.
Figure 18:
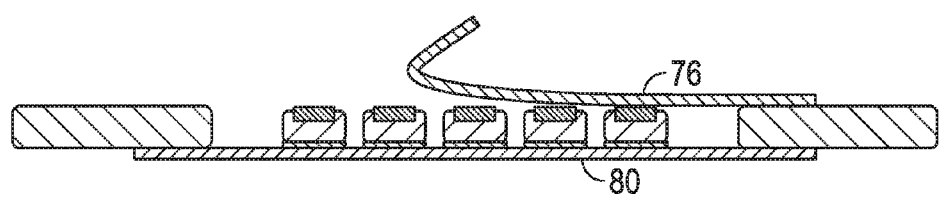
FIG. 18 illustrates an example of another processing step that can be performed in the formation of the semiconductor device package of any of FIGS. 2, 4, 6, 8 and 10.

As seen in FIG. 16 a first tape 74 which coupled the backmetal 70 to a frame 72 during the singulation process may be removed after a second tape 76 is applied to the top sides 18 of the singulated die 14 and to the frame 72. By non-limiting example, the first tape 74 (and also the second tape 76 and later described third tape 80) may be ultraviolet (UV) tape that may be more easily removed after UV irradiation of the tape. The film frame 72 may be flipped so that a water jet 78 is positioned as shown in FIG. 17, and the water jet 78 is used to spray water onto the backmetal 70 in a process known as backmetal jet ablation to remove portions of the backmetal that correspond with the scribe grids or streets described above, singulating the backmetal 70 and forming a plurality of semiconductor packages 2, 4, 6, 8, or 10. The film frame 72 spins during this process while the water jet 78 nozzle swings from side to side to get complete coverage and therefore removal of all the backmetal 70 corresponding with the scribe grids or streets. In various implementations, one or more liquids other than water could be used. As shown in FIG. 18 the frame 72 may then be flipped again, a third tape 80 may be applied to the backmetal 70 side of each die 14, and the second tape 76 may be removed, for further processing, such as an optional wafer wash. The singulated units including die 14 and intermediate metal layers 26, 28, 30, 32, 34, or 36, and tin layer 48, are then ready for the reflow processes described above. Naturally, the flip chip example given in FIGS. 11-12 does not involve this type of backmetal processing. The removal of backside metallization using a wafer wash tool allows the use of dry die singulation using plasma etch, as described above, for narrow streets and other benefits, to be used, while using another process for singulating the backmetal 70. This may be useful in circumstances wherein the backmetal 70 either takes a relatively long amount of time to be singulated using the dry plasma etch process or otherwise cannot be removed using the dry plasma etch process. Jet ablation can also be used even where there is exposed Sn provided proper processing conditions exist.

In implementations the substrate 50 need not have a silver layer 52, and the sublayers 38 themselves may have all of the silver and/or copper needed to form the desired intermetallics of intermetallic layers 56, 58, 60, 62, or 64.

Conventional solder paste or solder preform process results do not suggest the use of the backmetal devices and the flip chip devices disclosed herein. The vast majority of conventional die attach processes incorporate the addition of a solder paste or solder preform to add solder between the die and the bonding surface. Generally, had various processing advantages, including: such a process requires only the die surface and the bonding surface to be solderable (in other words, it is easier to produce a wafer with a backmetal that is simply solderable than a backmetal which is solderable and also the solder itself); more flexibility is allowed for the die attach material (i.e., different pads could be soldered using different types of paste or preform, if desired—which cannot easily be accomplished when the solder is laid down as a backmetal across the entire wafer); and thicker connections may be made with solder paste or preforms, generally, for when thermally induced stresses are a potential problem (such as with plastic packages). Also, attempts to use backmetal structures including layers arranged into a titanium/nickel/tin structure used in the industry to replace solder paste have demonstrated stresses that are too high due to the thick nickel layer, observed at deposition and/or at elevated temperatures including future reflows, which can cause line down problems at the end customer assembly site. In these attempts, the thick nickel layer was required, or in other words, the nickel layer thickness was increased in this titanium/nickel/tin structure, to account for tin diffusion to the nickel layer and the formation of nickel-tin intermetallics. What was observed is that the nickel integrity was limited as the nickel was consumed to form nickel-tin intermetallics, which compromised the die shear strength. Additional observations indicated that with previous thick nickel backmetal structures there was also a long deposition process to lay down the layers, and a higher cost, in general, when compared to using solder paste. These recognized advantages and disadvantages of conventional processes known to those of ordinary skill would not lead them to investigate non-solder paste/solder preform processes involving nickel and other backmetal intermetallics using just the backmetal or bump materials for soldering.

In implementations the packages 2, 4, 6, 8, 10, 12 are designed specifically for lower stress applications such as where the substrate 50 is part of a ceramic board. There may be additional advantages of the packages and methods disclosed in this document. The method implementations disclosed herein may permit extremely small die to be bonded. For example, a die that is about 200 microns by about 200 microns in area (or about 220 microns by 220 microns) can, if bonded using a conventional dispensed volume of solder, result in die tilt, movement from target location (die float), and the like, during die bonding. Such negative aspects for such small die generally may not occur with the methods disclosed herein.

With regards to the flip chip structures and methods disclosed herein, conventional flip chip bump structures are mounted to a board or substrate using solder paste, such as tin-lead or copper-tin-silver solder paste, to aid in the isolation of the die from stresses of the board or substrate. Sometimes large amounts of solder are used. Intermetallics are formed using such solder pastes, during the reflow process, but the flip chip bump structures will still melt during subsequent reflow processes due to the large amount of solder. This is actually by design so that the flip chip devices can be reworked or replaced if they are found to be faulty. Accordingly, conventional flip chip processing using solder paste does not suggest using the bump material itself to attach the die to the substrate to those of ordinary skill.

Semiconductor packages 2, 4, 6, 8, 10, 12 in implementations may be used, as discussed above, in light emitting diode (LED) applications. In implementations they may also be used for non-LED applications which involve mounting a die to a ceramic substrate (such as, by non-limiting example, mounting a die to a substrate 50 of a ceramic substrate). In implementations they may also be used for applications which involve mounting a die to a non-ceramic substrate, such as, by non-limiting example, a leadframe, an organic substrate, and any other substrate type not containing a ceramic material.

In implementations the backmetal examples described herein may be used for light emitting diode (LED) semiconductor packages and may allow a lower cost than conventional backmetal materials which can include backmetal structures of titanium/nickel/gold-tin layers arranged in that order (in some cases of which the gold-tin layer is 3 microns thick), which result in a materials savings of over 77% over conventional wafer back metal cost. The use of the materials disclosed herein may also reduce processing costs by allowing lower cost evaporation techniques instead of more costly sputtering techniques for applying layers. The gold-tin layer of the conventional titanium/nickel/gold-tin example has gold and tin in the ratio of 80/20 (weight ration) and melts at 280 degrees Celsius, which is higher than the standard 260 degrees Celsius reflow profile used for subsequent devices added to a board or substrate. The flip chip examples described herein may also be used for LED semiconductor packages wherein the elimination of wire bonds will prevent light from being blocked by the wire.

In places where the description above refers to particular implementations of semiconductor packages with a single reflow intermetallic layer and related methods and implementing components, sub-components, methods and sub-methods, it should be readily apparent that a number of modifications may be made without departing from the spirit thereof and that these implementations, implementing components, sub-components, methods and sub-methods may be applied to other semiconductor packages with a single reflow intermetallic layer and related methods.

What is claimed is:

1. A method of forming a semiconductor package, comprising:
    forming an intermediate metal layer onto a die, the intermediate metal layer comprising a plurality of sublayers coupled to each other, each sublayer comprising a metal selected from the group consisting of titanium, nickel, copper, silver, and any combination thereof;
    depositing a tin layer onto the intermediate metal layer; and
    reflowing at least a portion of the intermediate layer and the tin layer with a silver layer of a substrate to form an intermetallic layer having a melting temperature greater than 260 degrees Celsius;
    wherein prior to reflowing the portion of the intermediate layer and the tin layer with the silver layer:
        the substrate comprises the silver layer and a copper layer and no metal layers coupled between the silver layer and the copper layer, and;
        the copper layer is not coupled directly with a nickel layer.

2. The method of claim 1, wherein the substrate comprises a copper layer coupled to the silver layer of the substrate prior to reflowing the tin layer with the silver layer of the substrate.

3. The method of claim 1, wherein the plurality of sublayers of the intermediate metal layer includes a sublayer comprising titanium and a sublayer comprising nickel.

4. The method of claim 3, wherein the plurality of sublayers of the intermediate metal layer includes a sublayer comprising silver.

5. The method of claim 4, wherein the plurality of sublayers includes the following arrangement of the plurality of sublayers: a sublayer comprising titanium formed directly onto the die, a sublayer comprising nickel deposited directly onto the sublayer comprising titanium, and a sublayer comprising silver deposited directly onto the sublayer comprising nickel.

6. The method of claim 1, wherein the intermetallic layer comprises an intermetallic consisting of silver and tin.

7. The method of claim 1, wherein one of no solder paste and no solder preform is used during the method of forming the semiconductor package.

8. The method of claim 1, wherein forming the intermediate metal layer onto the die comprises forming a bump on each of a plurality of exposed pads of the die, where each exposed pad is surrounded by a passivation layer on the top side of the die.

9. The method of claim 1, wherein the intermetallic layer comprises an intermetallic consisting of copper and tin.

10. A method of forming a semiconductor package, comprising:
    forming an intermediate metal layer onto a die backside, the intermediate metal layer comprising a plurality of sublayers coupled to each other, each sublayer comprising a metal selected from the group consisting of titanium, nickel, copper, silver, and any combination thereof;
    depositing a tin layer onto the intermediate metal layer; and
    reflowing at least a portion of the intermediate layer and the tin layer with a silver layer of a substrate to form an intermetallic layer having a melting temperature greater than 260 degrees Celsius;
    wherein the plurality of sublayers of the intermediate metal layer includes a sublayer comprising copper, a sublayer comprising titanium, and a sublayer comprising nickel.

11. The method of claim 10, wherein the plurality of sublayers includes the following arrangement of the plurality of sublayers: a sublayer comprising titanium formed directly onto the die backside, a sublayer comprising nickel deposited directly onto the sublayer comprising titanium, and a sublayer comprising copper deposited directly onto the sublayer comprising nickel.

12. The method of claim 10, wherein the plurality of sublayers of the intermediate metal layer includes a sublayer comprising silver.

13. The method of claim 12, wherein the plurality of sublayers includes the following arrangement of the plurality of sublayers: a sublayer comprising titanium formed directly onto the die backside, a sublayer comprising nickel deposited directly onto the sublayer comprising titanium, a sublayer comprising copper deposited directly onto the sublayer comprising nickel, and a sublayer comprising silver deposited directly onto the sublayer comprising copper.

14. A method of forming a semiconductor package, comprising:
    forming an intermediate metal layer onto a die backside, the intermediate metal layer comprising a plurality of sublayers coupled to each other, each sublayer comprising a metal selected from the group consisting of titanium, nickel, copper, silver, and any combination thereof;
    depositing a tin layer onto the intermediate metal layer; and
    reflowing at least a portion of the intermediate layer and the tin layer with a silver layer of a substrate to form an intermetallic layer having a melting temperature greater than 260 degrees Celsius;
    wherein the plurality of sublayers of the intermediate metal layer includes a sublayer comprising titanium and a sublayer comprising copper.

15. The method of claim 14, wherein the plurality of sublayers includes the following arrangement of the plurality of sublayers: a sublayer comprising titanium formed directly onto the die backside, and a sublayer comprising copper deposited directly onto the sublayer comprising titanium.

16. The method of claim 14, wherein the plurality of sublayers of the intermediate metal layer includes a sublayer comprising silver.

17. The method of claim 16, wherein the plurality of sublayers includes the following arrangement of the plurality of sublayers: a sublayer comprising titanium formed directly onto the die backside, a sublayer comprising copper deposited directly onto the sublayer comprising titanium, and a sublayer comprising silver deposited directly onto the sublayer comprising copper.

* * * * *